(12) United States Patent
Kondo

(10) Patent No.: US 7,876,006 B2
(45) Date of Patent: Jan. 25, 2011

(54) ALTERNATOR FOR VEHICLE

(75) Inventor: Koji Kondo, Kiyosu (JP)

(73) Assignee: Denso Corporation, Kariya (JP)

( * ) Notice: Subject to any disclaimer, the term of this patent is extended or adjusted under 35 U.S.C. 154(b) by 544 days.

(21) Appl. No.: 11/822,675

(22) Filed: Jul. 9, 2007

(65) Prior Publication Data

US 2008/0054766 A1   Mar. 6, 2008

(30) Foreign Application Priority Data

Aug. 29, 2006 (JP) .............................. 2006-231708

(51) Int. Cl.
H02K 19/36 (2006.01)
H02K 11/00 (2006.01)
(52) U.S. Cl. .................................. 310/68 D
(58) Field of Classification Search ................ 310/64, 310/68 D
See application file for complete search history.

(56) References Cited

U.S. PATENT DOCUMENTS

| 5,886,403 | A | 3/1999 | Yoshinaga et al. | |
| 5,982,062 | A * | 11/1999 | Gautier | 310/68 D |
| 6,809,443 | B2 | 10/2004 | Nakamura et al. | |
| 7,282,824 | B2 * | 10/2007 | Fujioka | 310/68 D |
| 2008/0054766 | A1 * | 3/2008 | Kondo | 310/68 D |

FOREIGN PATENT DOCUMENTS

| JP | A 10-215552 | 8/1998 |
| JP | A 2002-119028 | 4/2002 |
| JP | A-2002-119029 | 4/2002 |
| JP | A-2004-112860 | 4/2004 |
| JP | A 2004-289028 | 10/2004 |
| WO | WO 02/19422 A2 | 3/2002 |
| WO | WO 2004/105126 A1 | 12/2004 |
| WO | WO 2005/048344 A2 | 5/2005 |

OTHER PUBLICATIONS

German Office Action issued Mar. 16, 2010 in German Patent Application No. 10 2007 034 014.3-32 with English translation.
Notification of Reasons for Rejection issued in Japanese Patent Application No. 2006-231708; Nov. 24, 2009; with English-language translation.

* cited by examiner

Primary Examiner—Queyen Leung
Assistant Examiner—David W. Scheuermann
(74) Attorney, Agent, or Firm—Oliff & Berridge PLC

(57) ABSTRACT

An alternator has a rectifier converting an alternating current to a direct current. The rectifier has a heat sink and rectifying elements. The sink has front and rear surfaces opposite to each other along a depth direction. The sink has holes each extending along the depth direction. Each element has a disk disposed in one hole and a semiconductor pellet attached to the disk. Each disk has upper and bottom surfaces opposite to each other along the depth direction. Each pellet is disposed on the upper surface. A contact surface of each disk is in contact with the sink. A position of the upper surface of each disk is placed between the first and second surfaces of the heat sink. A range of the contact surface of each disk is within a range between the upper and bottom surfaces of the disk.

18 Claims, 5 Drawing Sheets

FRONT SIDE ← → REAR SIDE

ALTERNATOR FOR VEHICLE

CROSS-REFERENCE TO RELATED APPLICATION

This application is based upon and claims the benefit of priority of the prior Japanese Patent Application 2006-231708 filed on Aug. 29, 2006 so that the contents of which are incorporated herein by reference.

BACKGROUND OF THE INVENTION

1. Field of the Invention

The present invention relates generally to an alternator mounted on a vehicle such as a passenger car, a truck or the like, and more particularly to an alternator with a rectifier for rectifying an alternating current generated in the alternator.

2. Description of Related Art

A slant nose type vehicle has recently been required to decrease a running resistance in a vehicle and to improve a field of vision for a driver. Further, a wide accommodation space of a vehicle compartment has recently been required to give better comfort to occupants of the vehicle. These requirements narrow an engine room space. In addition, the number of members disposed around an engine of the vehicle has been increased. Therefore, an alternator is inevitably disposed near the engine, so that heat received in the alternator from the engine has been increased. Further, the alternator is required to be made in a smaller size.

Further, because the number of current consumers has been increased to improve comfort and safety to the occupants, the alternator is required to generate a larger electrical energy. Therefore, heat generated in the alternator itself has been increased. Particularly, a rectifier having many diodes generates a large amount of heat. Therefore, it is required to improve a cooling performance of the rectifier disposed in a narrow space at a low cost. Each diode of the rectifier has a semiconductor pellet and a disk electrically connected with each other. To dissipate heat generated in the semiconductor pellets to the atmosphere, the disks of the rectifier are attached to a heat sink by soldering.

Further, to prevent thermal fatigue caused in the solder during the disk attachment, Published Japanese Patent First Publication No. 2002-119029 discloses an alternator wherein disks of rectifying elements (or diodes) of a rectifier are pressed into holes opened in a heat sink to fix the rectifying elements to the heat sink. In this alternator, the disks are formed of a material having a hardness higher than that of the heat sink. Therefore, the disks are hardly deformed when being inserted into the holes, and stresses of the disks on semiconductor pellets are reduced. Further, in this rectifier, the thickness of each disk is set to be equal to or larger than that of the heat sink to place the semiconductor pellet away from a side surface of the disk being in contact with the heat sink. With this structure, when the disk is pressed into a hole of the heat sink, a compressive stress added to the semiconductor pellet is considerably reduced.

However, holes in the heat sink are formed by the deformation processing such as press processing. In this case, a size of each hole cannot be precisely set, so that an allowance between the hole and disk becomes insufficient. Further, hardness at portions of the heat sink surrounding the holes is heightened by the deformation processing, so that it is difficult to sufficiently reduce stress on the semiconductor pellet when the disk is pressed into the hole. Further, when the disk is thickened so as to place the semiconductor pellet further away from a surface of the disk being contact with the heat sink, each rectifying element becomes large in a thickness direction. Therefore, the rectifier cannot be downsized.

Further, Published Japanese Patent First Publication No. 2004-112860 discloses an alternator wherein a plurality of sub-fins are formed in a complicate structure by deforming an aluminum plate by die casting and are attached to a heat sink to stand on the heat sink. Therefore, a heat dissipating area of the heat sink becomes large, so that a cooling performance of the rectifier can be improved without enlarging the heat sink along its extending direction.

However, although the sub-fins deformed by die casting can be arbitrarily shaped to heighten the cooling performance of the rectifier, surface portions of the sub-fins are hardened due to the casting. In this case, when the disks are pressed into the holes of the heat sink, it is sometimes difficult to reduce a stress on the semiconductor pellets.

SUMMARY OF THE INVENTION

An object of the present invention is to provide, with due consideration to the drawbacks of the conventional alternator, an alternator wherein a stress of a disk on a semiconductor pellet in a rectifying element of a rectifier is reduced regardless of hardness of a heat sink of the rectifier and hardness of the disk.

According to an aspect of this invention, the object is achieved by the provision of an alternator with a rectifier, the rectifier comprising a heat sink having a plurality of holes, and a plurality of rectifying elements, respectively, having a plurality of disks disposed in the holes of the heat sink and a plurality of semiconductor pellets attached to the disks. The heat sink has a first surface and a second surface opposite to each other along a depth direction of the rectifier. Each hole extends from the first surface along the depth direction. The semiconductor pellets are electrically connected with one another so as to produce a direct current from an alternating current. Each disk has an upper surface and a bottom surface opposite to each other along the depth direction. Each semiconductor pellet is disposed on the upper surface of the corresponding disk. A contact of each disk with the heat sink is limited to a contact surface of the disk. A position of the upper surface of each disk in the depth direction is set to place the upper surface between the first and second surfaces of the heat sink. A range of the contact surface of each disk in the depth direction is set to be within a range from the bottom surface of the disk to the upper surface of the disk.

With this structure, the alternator has the first feature that a position of the upper surface of each disk in the depth direction is placed between the first and second surfaces of the heat sink. Accordingly, as compared with a case where the thickness of a disk is equal to or larger than that of a heat sink according to a prior art, the length of each rectifying element can be shortened in the depth direction.

Further, the alternator has the second feature that a range of the contact surface of each disk in the depth direction is within a range from the bottom surface to the upper surface of the disk. The disk receives a pushing force from the heat sink through the contact surface along directions perpendicular to the depth direction when being pressed into one hole of the heat sink or being forcibly fitted to the heat sink. However, the semiconductor pellet disposed on the upper surface of the disk hardly receives this pushing force from the heat sink through the disk. Accordingly, a stress on the semiconductor pellet can be reduced regardless of hardness of the heat sink and hardness of the disk, so that the attachment of the semiconductor pellet to the disk can be stably maintained.

DETAILED DESCRIPTION OF THE PREFERRED EMBODIMENTS

Figure 1:
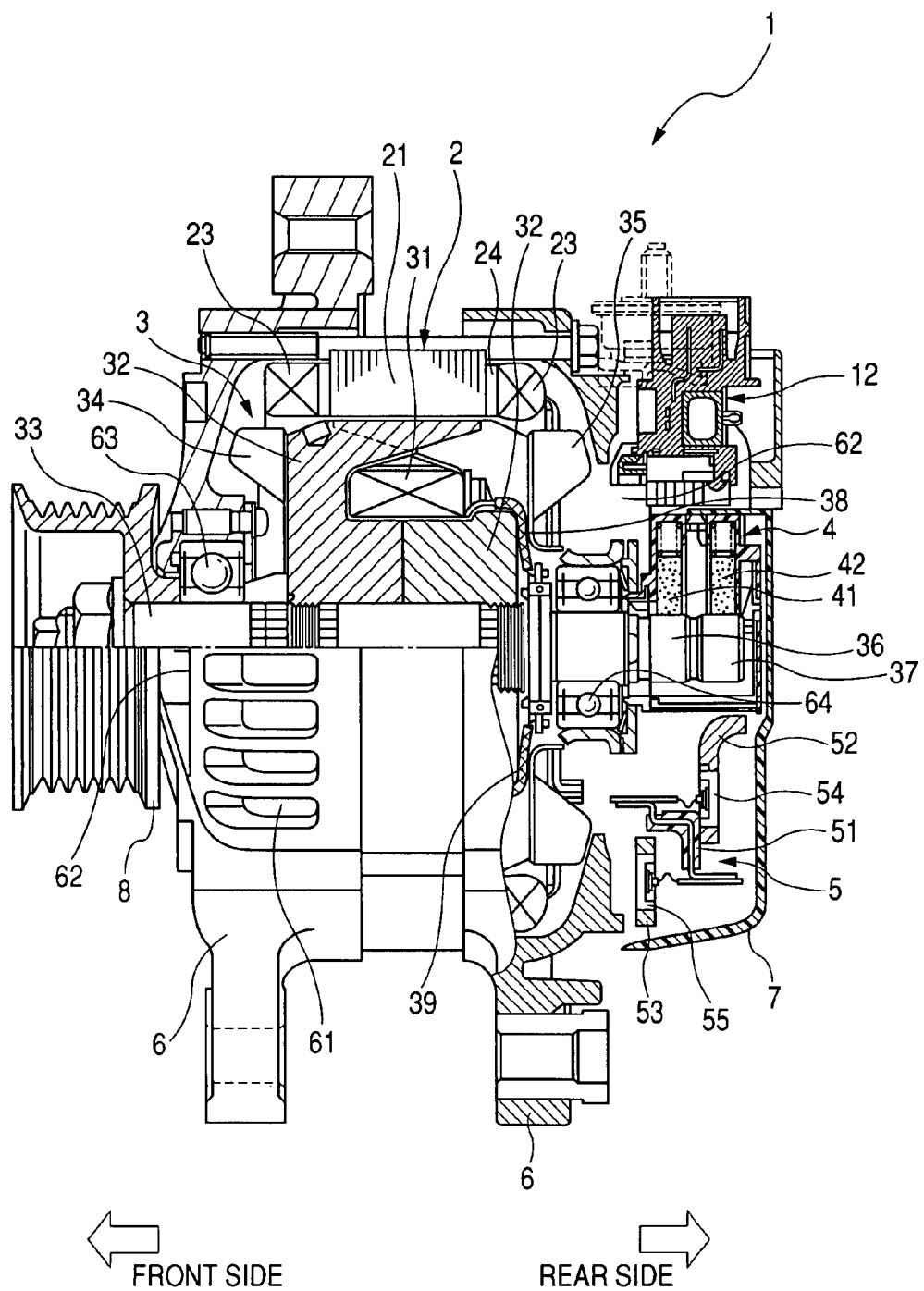
FIG. 1 is a longitudinal sectional view of an alternator according to an embodiment of the present invention.

An embodiment and its modifications of the present invention will now be described with reference to the accompanying drawings, in which like reference numerals indicate like parts, members or elements throughout the specification unless otherwise indicated.

Embodiment 1

FIG. 1 is a longitudinal sectional view of an alternator used for a vehicle according to this embodiment. As shown in FIG. 1, an alternator 1 has a cylindrical stator 2, a columnar rotor 3 disposed in a center hole of the stator 2, a brush device 4, a rectifier 5, a regulator 12, a frame 6, a pulley 8 fixed to the rotor 3 on a front side of the alternator 1, and a rear cover 7.

The stator 2 has a stator core 21, a three-phase stator wiring 23 and an insulator 24 electrically insulating the wiring 23 from the core 22. The core 21 has a plurality of slots aligned at equal intervals along a circumferential direction of the stator 2. The wiring 23 are accommodated in each of the slots to be wound around the core 22. The wiring 23 has three phase wirings connected with one another in Y-connection.

The rotor 3 has a rotational shaft 33, a pair of pole cores 32 fixed to the shaft 33 so as to place the shaft 33 in a center hole of the core 32, and a field wiring 31 wound around the core 32 cylindrically and coaxially. The cores 32 have a plurality of nail portions aligned along a circumferential direction of the core 32. The wiring 31 is formed of a copper wire covered with insulator or resin. A cooling fan 34 is attached, by welding or the like, to a front end surface of one pole core 32 placed on the front side. A cooling fan 35 is attached, by welding or the like, to a rear end surface of the other pole core 32 placed on a rear side of the alternator 1.

Two slip rings 36 and 37 are attached to a rear portion of the shaft 33 so as to be rotated with the shaft 33. Each of the slip rings 36 and 37 has two half portions, respectively, connected with ends of the wiring 31 through conductor lines 38 and 39.

The brush device 4, the rectifier 5 and the regulator 12 are fixed to a rear portion of the frame 6 and are covered with the rear cover 7 on the rear side.

The brush device 4 has two brushes 41 and 42, respectively, pressing the rings 36 and 37. A field current is supplied from the rectifier 5 to the wiring 31 of the rotor 3 through the brush device 4 and the rings 36 and 37. A flow direction of the field current in the wiring 31 is changed every half rotation of the shaft 33, so that a three-phase alternating current is generated in the stator wiring 23.

The rectifier 5 rectifies the alternating current of the wiring 23 to produce a direct current as an electrical energy generated in the alternator 1. The rectifier 5 has a terminal board 51 in which connection terminals are embedded, a positive electrode side heat sink 52 and a negative electrode side heat sink 53 facing each other at a predetermined interval, six rectifying elements (or diodes) 54 fitted to the heat sink 52, and six rectifying elements (or diodes) 55 fitted to the heat sink 53. The rectifying elements 54 and 55 serve as semiconductor devices. Heat generated in the elements 54 and 55 are transmitted to the heat sinks 52 and 53 and is dissipated to the atmosphere.

Figure 2:
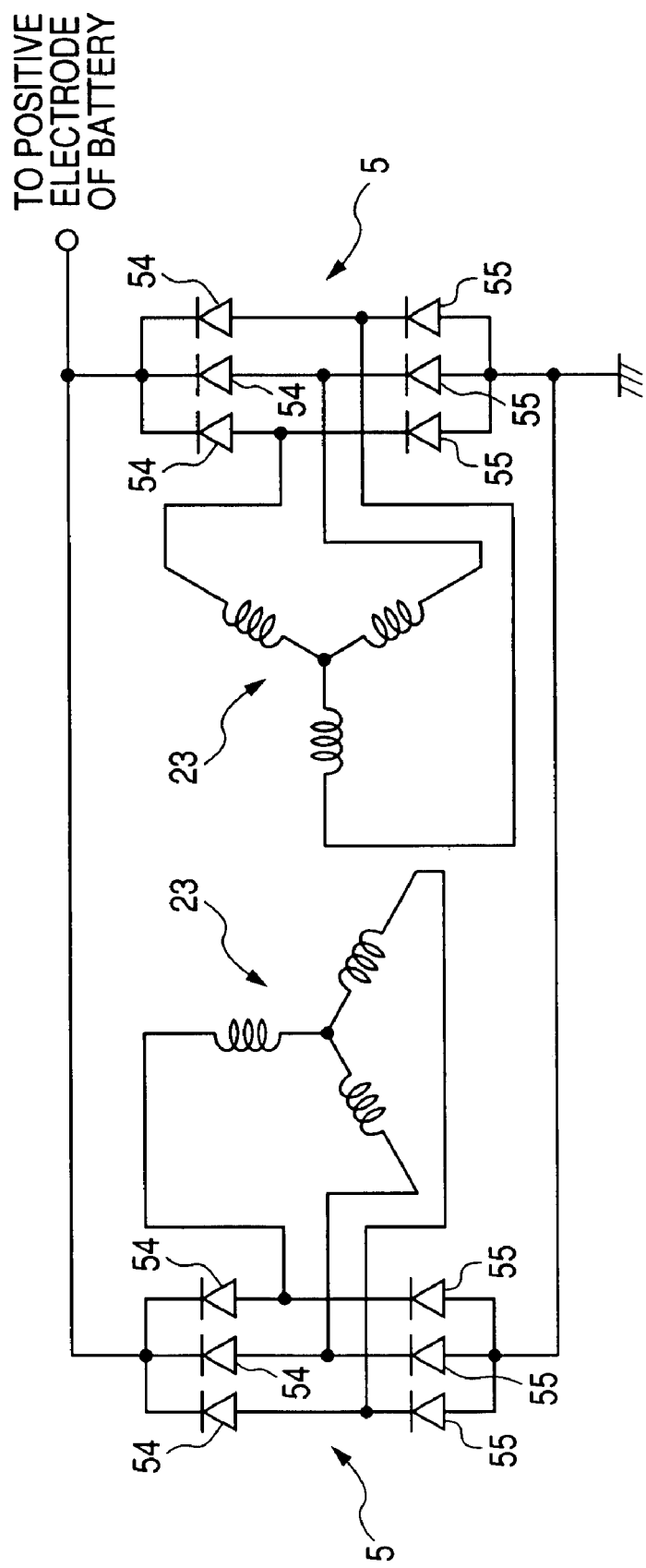
FIG. 2 is an electric circuit diagram of a rectifier shown in FIG. 1.

Further, the elements 54 and 55 are connected with the connection terminals of the board 51 so as to form a diode bridge circuit. The elements 54 are electrically connected with the heat sink 52, and the heat sink 52 is electrically connected with a positive electrode of a battery (not shown). The elements 55 are electrically connected with the heat sink 53, and the heat sink 53 is earthed. FIG. 2 is an electric circuit diagram of the rectifier 5. As shown in FIG. 2, each of the rectifying elements 54 and 55 is formed of a diode, and the rectifier 5 has two diode bridge circuits arranged in parallel to each other.

The regulator 12 regulates a value of the field current supplied to the field coil 31 to control an electrical energy generated in the alternator 1.

The frame 6 accommodates the stator 2 and the rotor 3. The frame 6 has a front bearing 63 and a rear bearing 64. The bearing 63 rotatably holds the front portion of the shaft 33. The bearing 64 rotatably holds the rear portion of the shaft 33. The frame 6 holds the stator 2 and the rotor 3 such that the rotor 3 is disposed in a center hole of the stator 2 at a predetermined interval from the stator 2. The frame 6 further has a plurality of outlet windows 61 and inlet windows 62. The windows 61 are aligned along the circumferential direction so as to face an end portion of the wiring 23 protruded from the core 21 toward the front side. The windows 62 are opened on the front and rear sides, respectively. When the fans 34 and 35 are rotated with the cores 32 and the shaft 33, the fans 34 and 35 receive cooling winds through the inlet windows 62, cools the stator 2 and the rotor 3 and discharge the winds through the outlet windows 61.

With this structure of the alternator 1, when a rotational force is transmitted from an engine (not shown) of a vehicle to the shaft 33 through a belt (not shown) and the pulley 8, the rotor 3 is rotated a long a predetermined rotation direction. When a field current is supplied from the rectifier 5 to the field wiring 31 of the rotated rotor 3 through the brush device 4, the nail portions of the rotated cores 32 are magnetized. Therefore, a three-phase alternating current is generated in the stator wiring 23. The regulator 12 adjusts the field current on the basis of a voltage of a battery (not shown) to control the current of the wiring 23. The rectifier 5 converts the alternating current of the wiring 23 into a direct current. This direct current is outputted to current consumers and the battery. Further, the direct current is supplied to the regulator 12 as the field current.

Next, a structure of the rectifier 5 is described in detail with reference to FIG. 3 and FIG. 4.

Figure 3:
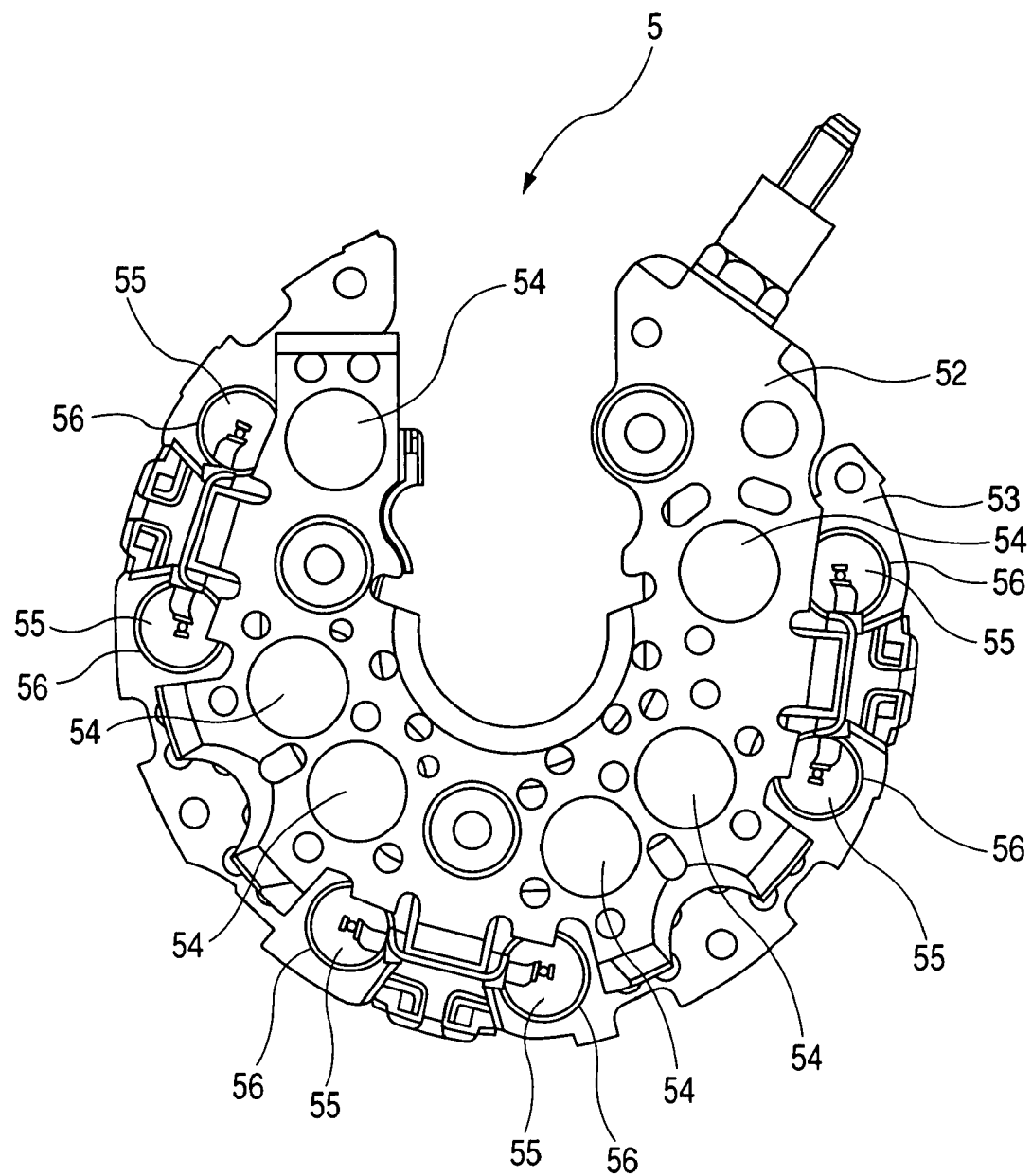
FIG. 3 is a plan view of the rectifier seen from the rear side.

FIG. 3 is a plan view of the rectifier 5 seen from the rear side. As shown in FIG. 3, the heat sink 52 has six holes almost concentrically disposed, and the rectifying elements 54 are, respectively, pressed into the holes of the heat sink 52 so as to be attached to the heat sink 52. The heat sink 53 has six holes 56 almost concentrically disposed, and the rectifying elements 55 are, respectively, pressed into the holes 56 of the heat sink 53 so as to be attached to the heat sink 53. Because the elements 54 and 55 are attached to the heat sinks 52 and 53 without using solder, the elements 54 and 55 can be attached to the heat sinks 52 and 53 at a lower cost while reducing the number of working steps for attaching the elements 54 and 55 to the heat sinks 52 and 53.

Figure 4:
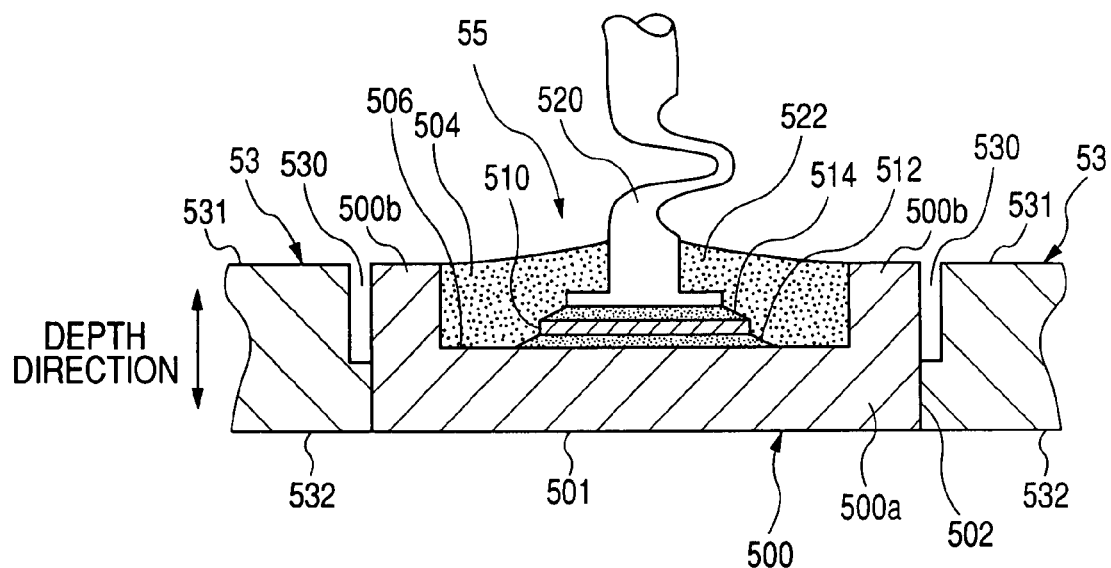
FIG. 4 is a sectional view of a rectifying element attached to a heat sink shown in FIG. 1.

FIG. 4 is a sectional view of one rectifying element 55 attached to the heat sink 53. All the elements 55 are attached to the heat sink 53 in the same manner as the element 55 shown in FIG. 4. Further, the rectifying elements 54 are attached to the heat sink 52 in the same manner as the elements 55 attached to the heat sink 53., so that detailed descriptions and illustrations for the elements 54 attached to the heat sink 52 are omitted.

As shown in FIG. 4, the heat sink 53 has a front surface 531 and a rear surface 532 opposite to each other along a depth direction of the rectifier 5. Each rectifying element 55 has a semiconductor pellet 510 and a disk 500 disposed in the hole of the heat sink 53. The pellets 510 of the elements 55 are electrically connected with one another so as to produce the direct current from the alternating current. The disk 500 is formed in a columnar shape having a concavity 504 on its one end. The disk 500 has an upper surface 506 and a bottom surface 501 opposite to each other along the depth direction. The upper surface 506 denotes a bottom of the concavity 504. A material of the disk 500 preferably has a hardness higher than that of a material of the heat sink 53. However, a material of the disk 500 may have a hardness equal to or lower than that of a material of the heat sink 53.

The semiconductor pellet 510 is soldered to the disk 500 on the upper surface 506, so that the pellet 510 is disposed on the upper surface 506 through a solder layer 512. Further, a lead line 520 is soldered to the pellet 510, so that the lead line 520 is disposed on the pellet 510 through another solder layer 514. The pellet 510 is covered with a protective layer 522 made of silicon rubber or resin.

More specifically, the disk 500 has both a solid portion 500a placed between the surfaces 501 and 506 and a hollow portion 500b having the concavity 504. Stiffness of the solid portion 500a in directions perpendicular to the depth direction is higher than that of the hollow portion 500b. A side wall of the heat sink 53 facing its hole is formed in a stepped shape so as to have an opening 530 between at least the hollow portion 500b of the disk 500 and the heat sink 53. The solid portion 500a is pressed into the hole of the heat sink 53 along a direction from the front surface 531 to the rear surface 532 such that a press fitting surface (or contact surface) 502 of the disk 500 is directly in contact with the heat sink 53. The hollow portion 500b and the heat sink 53 face each other with the opening 530 between, so that the hollow portion 500b is disposed away from the heat sink 53. Therefore, the solid portion 500a receives a pushing force from the heat sink 53 along directions substantially perpendicular to the depth direction, so that the disk 500 is forcibly fitted to the heat sink 53. In contrast, the hollow portion 500b receives no pushing force from the heat sink 53.

A position of the upper surface 506 in the depth direction is set to place the upper surface 506 at a level between the surfaces 531 and 532 of the heat sink 53. That is, the upper surface 506 is placed within the hole of the heat sink 53 so as to shorten a length of the element 55 in the depth direction.

Further, a range of the press fitting surface 502 of the disk 500 in the depth direction is set to be within a range from the bottom surface 501 to the upper surface 506 of the disk 500. In this embodiment, for example, the bottom surface 501 of the disk 500 and the rear surface 532 of the heat sink 53 are placed on the same plane, and a length of the surface 502 in the depth direction is set to be shorter than a distance between the surfaces 501 and 506.

Assuming that all portions of a disk including a hollow portion are pressed into a hole of a heat sink such that the hollow portion is in contact with the heat sink, the hollow portion receives a pushing force from the heat sink and is deformed. In this case, both a semiconductor pellet and a solder layer between the pellet and the disk are deformed in a conical shape. Therefore, the pellet is broken, or/and the pellet is detached from the disk.

In contrast, in this embodiment, only the solid portion 500a of the disk 500 having a higher stiffness is pressed into the hole of the heat sink 53. Therefore, the hollow portion 500b receives no pushing force from the heat sink when being inserted into the hole and being placed in the hole after the insertion. In this case, the hollow portion 500b is not substantially deformed, so that a stress on the pellet 510 and the solder layer 512 surrounded by the hollow portion 500b can be considerably reduced.

Accordingly, a stress on the pellet 510 of each rectifying element in the rectifier 5 can be reduced regardless of hardness of the heat sinks 52 and 53 and hardness of the disk 500 of each rectifying element. That is, the connection of the pellet 510 with the disk 500 can be stably maintained.

Modification 1

The heat sink 53 is formed by casting or deformation processing, so that a surface portion of the heat sink 53 surrounding each hole is hardened. Assuming that the contact surface 502 of the disk 500 is forcibly in contact with the hardened surface portion of the heat sink 53, it is required to further heighten a hardness of the disk 500 for the purpose of suppressing the deformation of the disk 500.

In this modification, the hardened surface portion of the heat sink 53 is preferably cut by a machine work, so that a contact portion of the heat sink 53 not hardened is forcibly in contact with the press fitting surface 502 of the disk 500. In this case, the hardness of the disk 500 can be set to be slightly higher than the hardness of the heat sink 53. Accordingly, a cost for producing the disk 500 can be lowered while suppressing the deformation of the disk 500 forcibly fitted to the heat sink 53. That is, a stress on the pellet 510 can be further reduced.

Modification 2

Figure 5:
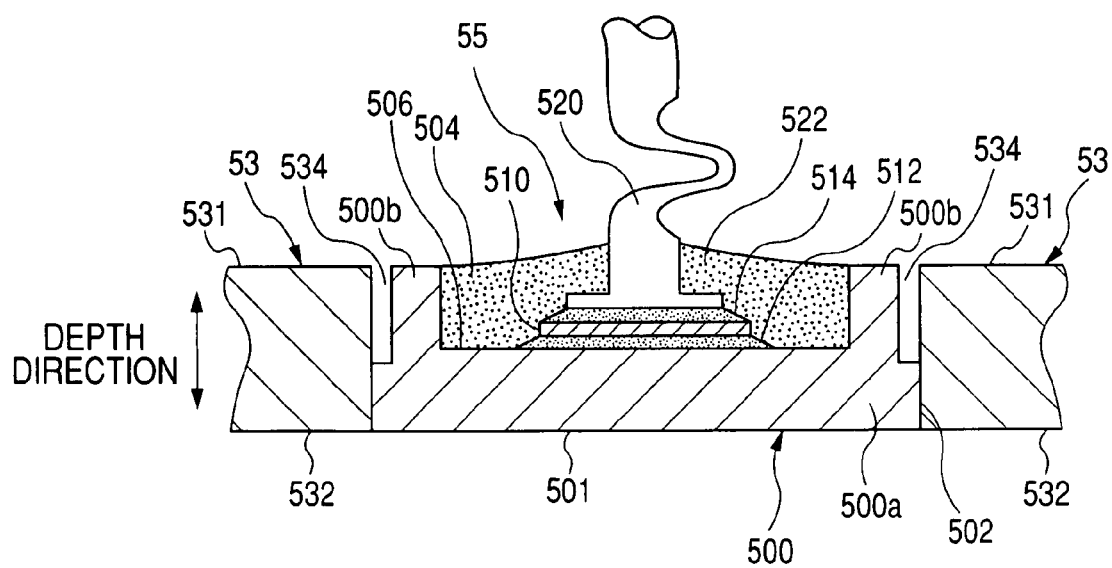
FIG. 5 is a sectional view of a rectifying element attached to a heat sink according to a second modification of the embodiment.

FIG. 5 is a sectional view of one rectifying element 55 attached to the heat sink 53 according to a second modification of this embodiment.

As shown in FIG. 5, a circumferential side surface of the disk 500 facing the heat sink 53 is formed in a stepped shape so as to have an opening 534 between at least the hollow portion 500b of the disk 500 and the heat sink 53. The press fitting surface 502 of the disk 500 corresponds to a portion of the circumferential side surface of the disk 500 facing no opening. A side surface of the heat sink 53 surrounding its hole is formed in a flat shape along the depth direction.

Because the hollow portion 500b of the disk 500 and the heat sink 53 face each other with the opening 534 between, the hollow portion 500b is not in contact with the heat sink 53. Therefore, the hollow portion 500b of the disk 500 fitted to the heat sink 53 receives no stress from the heat sink 53. Accordingly, in the same manner as in the rectifying element 55 shown in FIG. 4, a stress on the pellet 510 of the rectifying element 55 in the rectifier 5 can be reduced.

Further, when the disk 500 is pressed into the hole of the heat sink 53 along a fitting direction (or upper direction in FIG. 5) from the rear surface 532 to the front surface 531, the hollow portion 500b of the disk 500 does not come in contact with the heat sink 53. Accordingly, even when the disk 500 is pressed into the hole of the heat sink 53 along the fitting direction, a stress on the pellet 510 can be reduced. That is, the connection of the pellet 510 with the disk 500 can be stably maintained.

Modification 3

Figure 6:
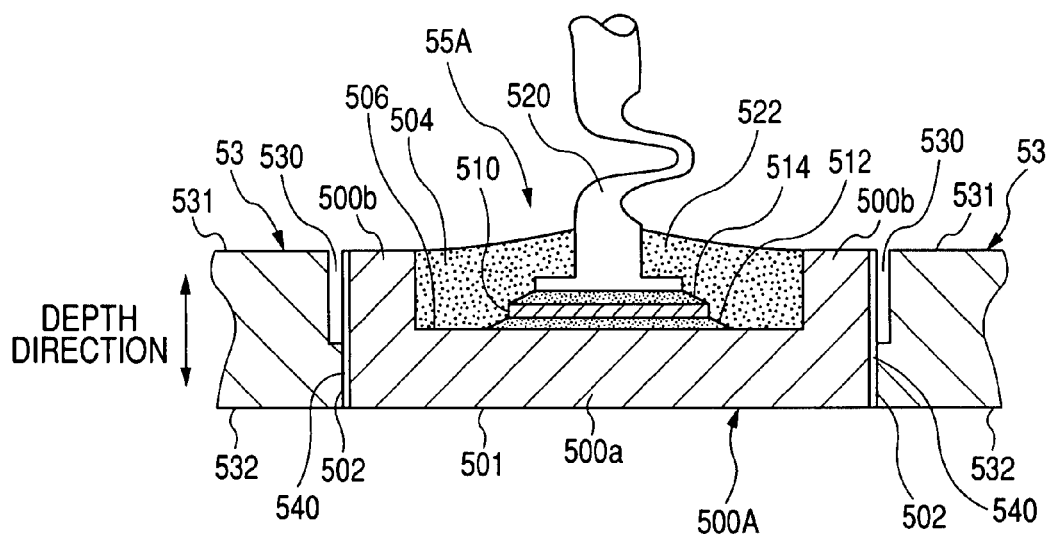
FIG. 6 is a sectional view of a rectifying element attached to a heat sink according to a third modification of the embodiment.

FIG. 6 is a sectional view of one rectifying element attached to the heat sink 53 according to a third modification of this embodiment.

As shown in FIG. 6, a disk 500A of each rectifying element 55A of the rectifier 5 differs from the disk 500 shown in FIG. 4 in that the disk 500A has a knurling portion 540 facing a side wall of the heat sink 53. The knurling portion 540 is formed by processing an outer surface portion of the disk 500A by knurling. A surface of the knurling portion 540 is composed of both a press fitting surface (or contact surface) 502 being in contact with the heat sink 53 and a non-contact surface disposed away from the heat sink 53 through the opening 530.

When the disk 500 shown in FIG. 4 is pressed into a hole of the heat sink 53 at a press-fitting force, a stress on the pellet 510 and the solder layer 512 is changed in proportional to the press-fitting force. Further, in a case where a size of the disk 500 is larger than that appropriate to a size of the hole, it is required to press the disk 500 into the hole at a larger press-fitting force. Therefore, when the disk 500 not processed by knurling is pressed into a hole of the heat sink 53, it is required to determine a size of the disk 500 with high precision.

In contrast, in this modification, even when a size of the disk 500A having the knurling portion 540 is not precisely determined, the disk 500A can be pressed into a hole of the heat sink 53 at a proper press-fitting force. Accordingly, a stress on the pellet 510 can be further reduced, and the connection of the pellet 510 with the disk 500 can be stably maintained.

In this modification, the whole side portion of the disk 500A facing the heat sink 53 is processed by knurling. Therefore, the knurling can be easily performed without predetermining an area for the knurling portion 540 with high precision. However, only a limited side portion of the disk 500A, on which the press-fitting portion 502 is formed, may be processed by knurling.

Further, the disk 500A may have a stepped wall facing the heat sink 53 such that the press-fitting surface 502 is formed on a knurling portion of the disk 500A.

Modification 4

Figure 7:
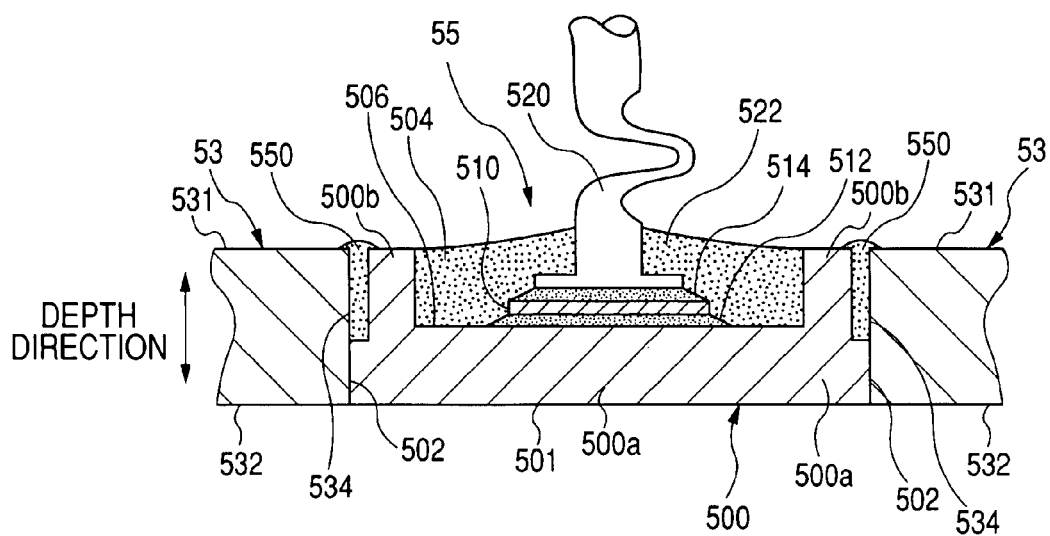
FIG. 7 is a sectional view of a rectifying element attached to a heat sink according to a fourth modification of the embodiment.

FIG. 7 is a sectional view of one rectifying element 55 attached to the heat sink 53 according to a fourth modification of this embodiment.

As shown in FIG. 7, the opening 534 is packed with a predetermined material 550. As compared with materials of the disk 500 and the heat sink 53, the material 550 has a low elasticity, and a thermal conductivity of the material 550 is not so low or is substantially the same as a thermal conductivity of the disk 500 or the heat sink 53.

Therefore, even when the alternator 1 receives water or liquid with an antifreezing agent spread on a road, there is no probability that the water or liquid enters the opening 534. Accordingly, various problems such as corrosion caused in the rectifier 5 by the water or liquid can be prevented.

Further, even when the material of the disk 500 differs from that of the heat sink 53 so as to produce a difference in coefficient of linear thermal expansion between the disk 500 and the heat sink 53, stress on the disk 500 caused by a change in temperature can be absorbed by the material 550 having a low elasticity. Accordingly, a stress on the pellet 510 can be reduced, and the connection of the pellet 510 with the disk 500 can be stably maintained.

Moreover, because the material 550 has a preferable thermal conductivity, heat generated in the pellet 510 can be smoothly transmitted to the heat sink 53 through the material 550. Accordingly, a cooling performance of the rectifier 5 can be improved.

In this modification, only the opening 534 is packed with the material 550. However, all the rectifier 5 including the opening 534 may be covered with a paint film having a low elasticity to prevent various problems caused by water or liquid including an antifreezing agent.

Further, in the same manner as the opening 534 packed with the material 550, the opening 530 shown in FIG. 4 or FIG. 6 may be packed with the material 550.

In the embodiment and modifications, each of the holes in the heat sinks 52 and 53 penetrates through the corresponding heat sink. However, each of the heat sinks 52 and 53 may have a thinned-wall portion on which each of non-penetrating holes is placed. In this case, each disk 500 may be attached to one thinned-wall portion by a conductive adhesive material such as solder.

Further, although the rectifier 5 is disposed in the alternator 1, this embodiment should not be construed as limiting the present invention. For example, the present invention can be applied for any semiconductor device including the rectifier 5.

What is claimed is:

1. An alternator, which generates an alternating current, converts the alternating current to a direct current in a rectifier and outputs the direct current, the rectifier comprising:
   a heat sink having a plurality of holes, the heat sink having a first surface and a second surface opposite to each other along a depth direction of the rectifier, each of the holes extending from the first surface along the depth direction; and
   a plurality of rectifying elements, respectively, having a plurality of disks disposed in the holes of the heat sink and a plurality of semiconductor pellets attached to the disks, the semiconductor pellets being electrically connected with one another so as to produce the direct current from the alternating current, each of the disks having an upper surface and a bottom surface opposite to each other along the depth direction, each of the semiconductor pellets being disposed on the upper surface of the corresponding disk, a contact of each of the disks with the heat sink being limited to a contact surface of the disk,
   wherein a position of the upper surface of each disk in the depth direction is set to place the upper surface between the first and second surfaces of the heat sink, a range of the contact surface of each disk in the depth direction is set to be within a range from the bottom surface of the disk to the upper surface of the disk, the heat sink has a stepped wall surrounding each hole such that the wall is stepped along the depth direction so as to change an area of the hole on a plane perpendicular to the depth direction and to form an opening between the corresponding disk and the stepped wall of the heat sink, each disk has a non-contact surface spaced from the heat sink through the opening such that both the contact surface and the non-contact surface of the disk serve as a side surface facing the heat sink, and the side surface of the disk is formed in a flat shape along the depth direction.

2. The alternator according to claim 1, wherein each of the disks has a knurling portion such that an outer circumferential surface of the disk facing the heat sink and including the contact surface is placed on the knurling portion, the knurling portion being obtained by processing an outer circumferential portion of the disk by knurling.

3. The alternator according to claim 1, wherein each of the disks has a knurling portion on which the contact surface of the disk is placed, the knurling portion being obtained by processing the disk by knurling.

4. The alternator according to claim 1, wherein a contact portion of the heat sink being in contact with the contact surface of the disk is obtained by cutting off an outer surface portion of the heat sink by a machine work.

5. The alternator according to claim 1, wherein each disk has a stepped wall facing a side wall of the corresponding hole of the heat sink so as to have an opening between the stepped wall of the disk and the side wall of the heat sink, and the stepped wall of the disk is partitioned into both the contact surface and a non-contact surface spaced from the heat sink through the opening.

6. The alternator according to claim 1, wherein each disk has a side surface facing the heat sink, the side surface is divided into the contact surface and a non-contact surface disposed away from the heat sink through an opening, and the opening is packed with a predetermined material differing from materials of the heat sink and the disk.

7. The alternator according to claim 6, wherein the predetermined material has an elasticity lower than those of the heat sink and the disk.

8. The alternator according to claim 6, wherein the predetermined material has a thermal conductivity substantially the same as that of the heat sink or the disk.

9. The alternator according to claim 1, wherein the range of the contact surface of each disk agrees with the range from the bottom surface of the disk to the upper surface of the disk.

10. The alternator according to claim 1, wherein each rectifying element is mounted on the upper surface through a solder layer.

11. The alternator according to claim 1, wherein each disk has a side wall disposed on its upper surface so as to place the corresponding semiconductor pellet in a concavity surrounded by the side wall.

12. The alternator according to claim 1, wherein the contact surface of each disk is in contact with the heat sink such that the disk is forcibly fitted to the heat sink.

13. The alternator according to claim 1, wherein each disk is adapted to be pressed into the heat sink to make the contact surface of the disk being in contact with the heat sink.

14. The alternator according to claim 1, wherein each hole of the heat sink penetrates through the heat sink from the first surface to the second surface of the heat sink.

15. The alternator according to claim 1, wherein the heat sink has a bottom portion such that each hole extends from the first surface to the bottom portion, and the bottom surface of the corresponding disk is disposed on the bottom portion of heat sink.

16. The alternator according to claim 1, wherein the contact surface of each disk in the depth direction is limited within the range from the bottom surface of the disk to the upper surface of the disk.

17. The alternator according to claim 1, wherein a length of the contact surface of each disk in the depth direction is set to be shorter than a distance between the first and second surfaces of the heat sink.

18. The alternator according to claim 1, wherein a thickness of each disk ranging from the upper surface to the bottom surface is set to be smaller than a thickness of the heat sink ranging from the first surface to the second surface.

* * * * *